United States Patent Office 3,131,309
Patented Apr. 28, 1964

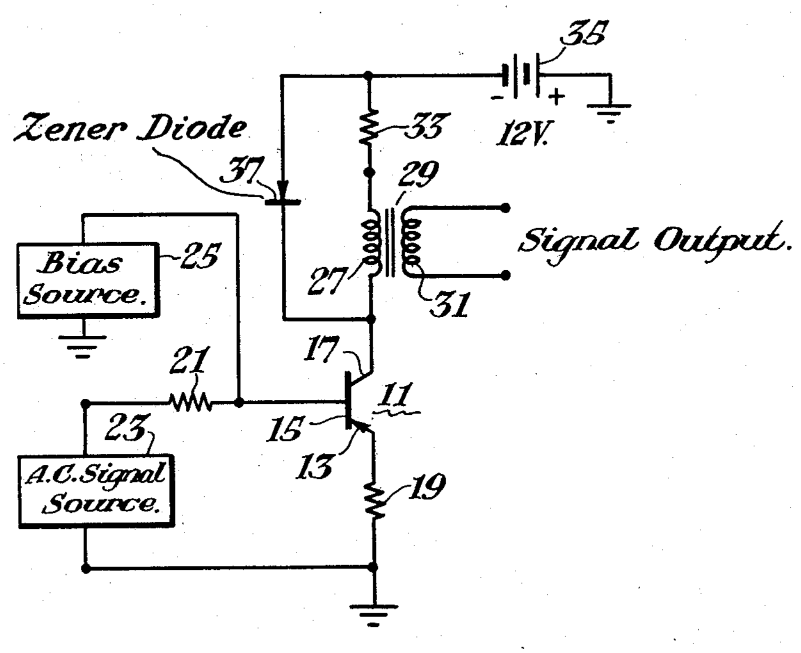
INVENTOR.
Thomas J. Blocher, Jr
BY W. L. Stout
HIS ATTORNEY

3,131,309

TRANSISTOR AMPLIFIER-SWITCHING CIRCUIT WITH ZENER DIODE LIMITING FOR ELIMINATION OF UNATTENUATED SIGNALS

Thomas J. Blocher, Jr., Monroeville, Pa., assignor to Westinghouse Air Brake Company, Wilmerding, Pa., a corporation of Pennsylvania Filed Oct. 30, 1958, Ser. No. 770,770
6 Claims. (Cl. 307—88.5)

This invention relates to switching circuits and more particularly to a transistor amplifying and switching circuit.

In transistors a small though significant current flows in the collector electrode even when the transistor is normally biased "off." Further, this current, which is commonly designated as $I_{co}$ may vary in magnitude with changes in temperature and from transistor to transistor. This small current, although unobjectionable in most circuits, limits the degree of attenuation obtained when transistors are employed in switching circuits. Therefore, it has been found desirable in certain instances to provide a switching operation by biasing a transistor to saturation rather than by biasing said transistor to "cut-off." However, for high impedance switching applications the degree of attenuation obtained by the saturation of the transistor is still insufficient.

Accordingly, it is a principal object of this invention to provide a new and improved transistor switching circuit having a high degree of attenuation.

It is another object of this invention to provide a new and improved transistor amplifier-switching circuit.

In the attainment of the foregoing objects I provide a switching circuit comprising a transistor having emitter, base, and collector electrodes. A signal input and a bias potential are connected to the base of the transistor and the output is taken from across an inductive element connected to the collector electrode. A Zener diode is connected in parallel or shunt across said inductive element with the electrodes of said diode being in opposing relation to normal current flow in said collector circuit. When switching, the transistor saturates and an inverse voltage is developed across the diode to cause the diode to break down and conduct, thus shorting the inductive element and therefore any output signal.

It should be understood at outset that although a P-N-P type transistor is considered in detail herein, an N-P-N type transistor could also be satisfactorily used in my circuit, provided, of course, that the biasing polarities are reversed, as is well known in the art.

Other objects and advantages of my invention will become apparent from the following description and the accompanying drawing in which:

The sole figure is a schematic diagram of a transistor amplifier-switch in accordance with my invention.

I shall first describe my amplifier-switching circuit and shall then point out the novel features thereof in the appended claims.

Referring to the figure, P-N-P transistor 11 has three electrodes, an emitter 13, a base 15 and a collector 17. Transistor 11 is connected through an impedance shown as a resistor 19 to ground reference. Base 15 is connected through an impedance shown as a resistor 21 to an alternating current signal source 23. Base 15 is also directly connected to a biasing source 25. Collector 17 is connected to one terminal of a primary winding 27 of an output transformer 29. The other terminal of primary 27 is connected through an impedance shown as a resistor 33 to the negative pole of an operating source shown as a battery 35. The positive pole of battery 35 is grounded. The signal output from the circuit is coupled from primary winding 27 to secondary winding 31 of transformer 29. The impedance of resistor 33 is approximately three times larger than the impedance of resistor 19 for purposes which will be explained hereinbelow. A diode 37 of the well known Zener type which has a predetermined breakdown voltage is connected in parallel to primary winding 27 and resistor 33. Diode 37 is poled to provide a high resistance to current flow in a normal direction with respect to said transistor, that is, a normal direction assumed to be from the positive pole of battery 35, ground, emitter 13 to collector 17 of transistor 11, primary 27 and resistor 33 to the negative pole of battery 35.

The following table shows the values of the circuit components used in one satisfactory test. These values are set forth solely as an example, and the invention is, of course, not limited to the particular values given.

| | |
|---|---|
| Transistor 11 | General Electric 2N43. |
| Diode 37 | Zener type 7.2 volts D.C. for reverse conduction. |
| Resistance 19 | 1000 ohms. |
| Resistance 21 | 18,000 ohms. |
| Resistance 33 | 3000 ohms. |
| Transformer 29 | Impedance match to next stage. |
| Battery 35 | 12 volts D.C. |

The operation of the circuit is substantially as follows and performs the dual function of an amplifier and a switch. With a voltage of approximately minus one volt D.C. coupled from bias source 25 to base 15, and with the circuit components having the values given in the above table and connected as shown in FIG. 1, transistor 11 will operate as a Class A amplifier.

As indicated before it is desired that transistor 11 be a high impedance amplifier, that is, that it present a high impedance to the input signal. This is accomplished by placing resistor 19 in the emitter circuit. Omitting or by passing resistor 19 would improve the attenuation due to the saturation of the transistor, however, this would also undesirably lower the input impedance.

To perform the switching operation, the voltage from bias source 25 is increased, that is, made more negative until transistor 11 saturates. As noted before, resistor 19, the emitter to collecter circuit of transistor 11, primary 27, and resistor 33 are effectively connected in series and to the negative terminal of battery 35 which, as shown, has a potential of 12 volts. The impedance of primary 27 is relatively small, and the impedance of transistor 11 at saturation is substantially zero. Since resistor 33 is three times larger than resistor 19, and due to the inherent voltage dividing action of a series circuit, the voltage drop across resistor 33 will tend to be approximately 9 volts and the voltage drop across resistor 19 will tend to be approximately 3 volts. Collector 17, connected to the junction of resistors 19 and 33, will thus tend to assume a potential of minus 3 volts, as shown, the positive terminal battery 35 connected to ground reference. From the above table it will be seen that diode 37 breaks down at 7.2 volts reverse voltage, that is, with its upper electrode, as oriented in the drawings, being 7.2 volts negative with respect to its lower electrode. As soon as the collector 17, intending to acquire a potential of minus 3 volts, reaches a potential of minus 4.8 volts, a 7.2 volt differential is developed between the electrodes of diode 37. Consequently at this point, diode 37 will start conducting in its reverse direction which is the normal direction of current flow through transistor 11. Once diode 37 breaks down and begins conducting it presents a relatively low impedance to current flowing therethrough and effectively short circuits primary 27. Thus essentially all of the output signals will be by-passed by diode 37 and little if any signal will appear across primary 27. A high degree of attenuation of the signal output is thu provided. It will of course be appreciated that resistors having other impedance ratios could be used in place of resistors 19 and 33, and that a battery having a different potential could also be satisfactorily employed. Conceivably, a resistor might also be employed in place of primary 27 or, if primary 27 contains sufficient internal resistance, resistor 33 need not be used.

In a test conducted with my circuit at 30 kc. frequency the difference in output between the "on" and "off" conditions was 85 db. In contrast, switching by simply saturating a transistor provided a difference in output of only 49 db. Accordingly, my circuit improved the attenuation by 36 db.

While my invention has been described with reference to a particular embodiment thereof, it will be understood that various modifications may be made by those skilled in the art without departing from the invention. The appended claims are therefore intended to cover all such modifications within the true spirit and scope of the invention.

Having thus described my invention, what I claim is:

1. A switching circuit arranged to be connected to operating means, said switching circuit comprising a conductive device including a plurality of electrodes, a plurality of impedances connected in a circuit path including at least a pair of said electrodes and said operating means, means for applying an input signal to said conductive device, and output signal coupled from a first of said impedances, a Zener type diode connected in parallel with at least said first impedance and poled to present a high resistance to current flowing in the normal direction through said device, and biasing means for at times driving said device to saturation, said impedances being so proportioned that upon saturation of said device a division of the potential therebetween is effected to cause said diode to conduct in a reverse direction to short circuit said first impedance by by-pass said output signal.

2. A switching circuit arranged to be connected to operating means, signal input means and biasing means, said circuit comprising a transistor having emitter, base and collector electrodes, said signal input means connecting an input signal across said emitter to base electrodes, an emitter to collector circuit comprising a plurality of impedances connected in series with said operating means, an output signal coupled from a first of said impedances, and a Zener type diode connected in parallel with said first impedance and poled to present a high resistance to current flowing in the normal direction in said emitter to collector circuit, said biasing means at times driving said transistor to saturation, saturation of said transistor causing a voltage division between said impedances to render said diode conductive in a reverse direction to short circuit said first impedance to by-pass said output signal.

3. A switching circuit arranged to be connected to operating means, said circuit comprising a transistor having emitter, base and collector electrodes, means for applying an input signal between said emitter and base electrodes, an inductance in the emitter to collector circuit across which an output signal is obtained, a plurality of resistors connected in series to said inductance, said operating means connected in said emitter to collector circuit, a Zener diode connected in parallel to said inductance, said Zener diode connected to present a high impedance to current flowing in the normal direction through said transistor, and means for at times driving said transistor to saturation, said resistors and said inductance being proportioned to produce a division of the potential across said operating means during the times said transistor saturates for developing a voltage sufficient to break down said diode and cause current flow in the reverse direction therethrough to short circuit said inductance to by-pass said output signal.

4. A transistor amplifier-switching circuit arranged to be connected to operating means, said circuit comprising a transistor having an emitter electrode, a collector electrode and a base electrode, means for applying an input signal across said base and emitter electrodes; an emitter to collector circuit including a first resistance, an inductance across which an output signal is obtained, a second resistance, and said operating means; a Zener diode connected in parallel to said inductance and said second resistance, said diode connected to provide a high impedance to current flowing in the normal direction through said transistor; and biasing means for at times driving said transistor to saturation; said first and second resistances being proportioned to produce a potential division therebetween during saturation of said transistor to cause said diode to conduct in a reverse direction and short circuit said inductance whereby a high attenuation of any output signal from said inductance is obtained.

5. A switching circuit arranged to be connected to operating means, said circuit comprising a transistor having emitter, base and collector electrodes, means for applying an input signal across said base and emitter electrodes, an emitter to collector circuit including a first, second and third impedances connected in series across said operating means, a Zener diode connected in parallel to said first and second impedances and poled to provide a high impedance to current flowing in the normal direction through said transistor, and biasing means for at times driving said transistor to saturation, being so dimensioned that during saturation of said transistor the resulting said second and third impedances voltage division will cause said diode to conduct in the reverse direction to short circuit said first and second impedances and by-pass any output signal at said collector electrodes.

6. In a transistor amplifier-switching circuit arranged to be connected to operating means, said circuit comprising a transistor having emitter, base and collector electrodes, a first resistance having one terminal connected to said emitter and the other terminal connected to one terminal of said operating means, means for applying an input signal across said base and to the other terminal of said first resistance, said first resistance causing said transistor to present a high impedance to the input signal, a transformer having a primary and a secondary winding, said primary winding and a second resistance being connected in series from said collector to the other terminal of said operating means, said transformer coupling out the output signal from said transistor, and a Zener type diode connected in parallel to said primary winding and said resistance, said Zener diode connected to present a high impedance to current flowing in the normal direction through said transistor, and means electrically associated with said base for at times driving said transistor to saturation, said first and second resistances being so proportioned that a voltage division of the potential across said operating means during the times said transistor saturates produces a voltage across said diode sufficient to break down said diode and cause current flow in the reverse direction therethrough whereby said primary winding is short-circuited and any output signal is by-passed.

References Cited in the file of this patent

UNITED STATES PATENTS

| | | |
|---|---|---|
| 2,457,131 | Curtis | Dec. 28, 1948 |
| 2,542,152 | McConnell | Feb. 20, 1951 |
| 2,832,900 | Ford | Apr. 29, 1958 |
| 2,861,237 | Zelina | Nov. 18, 1958 |
| 2,861,239 | Gilbert | Nov. 18, 1958 |

| | | |
|---|---|---|
| 2,866,106 | Schuh | Dec. 23, 1958 |
| 2,914,683 | Terry | Nov. 24, 1959 |
| 2,924,724 | Booker | Feb. 9, 1960 |

OTHER REFERENCES

Shea: Transistor Circuits, Willey & Sons, 1953 (pages 51 and 167 relied on) TK–7872–T7355.

Millman and Taub: Pulse and Digital Circuits, Mc-Graw-Hill, 1956 (pages 435, 436 relied on) TK–7835–M55.

UNITED STATES PATENT OFFICE
CERTIFICATE OF CORRECTION

Patent No. 3,131,309 April 28, 1964

Thomas J. Blocher, Jr.

It is hereby certified that error appears in the above numbered patent requiring correction and that the said Letters Patent should read as corrected below.

Column 4, line 46, strike out "said second and third impedances" and insert the same before "being" in line 44, same column 4.

Signed and sealed this 18th day of August 1964.

(SEAL)
Attest:

ERNEST W. SWIDER
Attesting Officer

EDWARD J. BRENNER
Commissioner of Patents